United States Patent [19]

Becker et al.

[11] Patent Number: 4,641,046

[45] Date of Patent: Feb. 3, 1987

[54] NOR GATE WITH LOGICAL LOW OUTPUT CLAMP

[75] Inventors: Scott T. Becker; Michael J. Bergman, both of San Jose; Shueh-Mien Lee, Sunnyvale, all of Calif.

[73] Assignee: Signetics Corporation, Sunnyvale, Calif.

[21] Appl. No.: 745,475

[22] Filed: Jun. 17, 1985

[51] Int. Cl.[4] .................. H03K 19/094; H03K 19/20; H03K 5/08
[52] U.S. Cl. .................................... 307/448; 307/450; 307/468; 307/554; 307/555; 307/568
[58] Field of Search ............... 307/443, 448, 450, 468, 307/465, 469, 554, 555, 568; 364/716; 340/825.83, 825.87, 825.91

[56] References Cited

U.S. PATENT DOCUMENTS

| | | | |
|---|---|---|---|
| 4,041,459 | 8/1977 | Horninger | 307/468 X |
| 4,375,039 | 2/1983 | Yamauchi | 307/530 |
| 4,445,051 | 4/1984 | Elmasry | 307/448 X |
| 4,538,075 | 8/1985 | Varadarajan | 307/443 X |

Primary Examiner—Larry N. Anagnos
Attorney, Agent, or Firm—R. J. Meetin; R. T. Mayer; J. Oisher

[57] ABSTRACT

A NOR gate consisting of a set of input FET's ($Q1_1$–$Q1_M$) has a clamp (12/Q2) that, when at least one of the input FET's is turned on, clamps the logical low level of the gate output voltage at a value which is largely constant irrespective of how many of the input FET's are conductive.

14 Claims, 3 Drawing Figures

NOR GATE WITH LOGICAL LOW OUTPUT CLAMP

FIELD OF USE

This invention relates to logic gates suitable for semiconductor integrated circuits.

BACKGROUND ART

Logic gates are used extensively in digital integrated circuits. FIG. 1 shows a conventional NOR gate formed with M identical enhancement-mode N-channel insulated-gate field-effect transistors (FET's) $Q1_1$, $Q1_2$, ... and $Q1_M$ whose (insulated) gate electrodes respectively receive M input signal voltages $V_{I1}$, $V_{I2}$, ... and $V_{IM}$. The drains of FET's $Q1_1$–$Q1_M$ are connected to an electrical conductor LD that provides an output signal voltage $V_O$ as the logical NOR of input voltages $V_{I1}$–$V_{IM}$. A current supply 10 consisting of a depletion-mode N-channel FET QS is source-to-drain connected between conductor LD and a terminal for a high supply voltage $V_{DD}$. FET QS has its gate electrode tied to its source so as to act as a load for FET's $Q1_1$–$Q1_M$. Their sources are connected to a terminal for a low supply voltage $V_{SS}$ by way of another electrical conductor LS.

Use of conventional terminology for positive logic facilitates an understanding of the operation of this gate. A low voltage is a logical low referred to as logical "0". A high voltage is a logical high referred to as logical "1".

Each FET $Q1_1$... or $Q1_M$ is turned on when corresponding input $V_{I1}$... or $V_{IM}$ is at a logical high voltage exceeding $V_{SS}$ by at least the FET threshold voltage. Output $V_O$ is at logical "1" when inputs $V_{I1}$–$V_{IM}$ are all at logical "0" so that FET's $Q1_1$–$Q1_M$ are off. As one of inputs $V_{I1}$–$V_{IM}$ rises to logical "1" to turn on the corresponding one of FET's $Q1_1$–$Q1_M$, output $V_O$ falls to logical "0".

The actual logical low voltage level for output $V_O$ depends upon the number of FET's $Q1_1$–$Q1_M$ turned on. The logical "0" voltage is lower when more of FET's $Q1_1$–$Q1_M$ are conductive. This is disadvantageous in many applications because the time needed to differentially sense output $V_O$ can vary drastically from the case where one of FET's $Q1_1$–$Q1_M$ is turned on to the situation where all are conductive.

DISCLOSURE OF THE INVENTION

This invention centers on a relatively simple mechanism for clamping the logical low output voltage of a logic gate of the foregoing type. This makes it easier to differentially sense the output signal and thereby enhances sensing speed over the prior art gate described above. The present logic gate is especially useful in applications such as programmable logic devices.

More particularly, the present gate contains a plurality of like-polarity enhancement-mode first FET's. Each first FET has a gate electrode for receiving a corresponding input voltage, a source, and a drain. A conductor is coupled to the drains of the first FET's for providing an output voltage. A current supply is coupled between the conductor and a terminal for a first supply voltage. The sources of the first FET's are coupled to a terminal for a second supply voltage by way of a clamp. When at least one of the first FET's is conductive, the clamp forces the output voltage to approach a value that is largely the same regardless of the number of first FET's turned on. The clamped value of the output voltage lies between the two supply voltages substantially closer to the second supply voltage.

The clamping is preferably done with a like-polarity enhancement-mode second FET having a gate electrode coupled to the conductor, a source coupled to the second supply voltage terminal, and a drain coupled to the sources of the first FET's. The characteristics of the FET's are chosen such that the second FET is saturated when one or more of the first FET's are turned on. In saturation, the gate-to-source voltage of the second FET is substantially independent of the drain-to-source voltages of the first FET's. Consequently, the number of conductive first FET's does not significantly effect the conductive level of the second FET as long as at least one of the first FET's is turned on. This provides the clamping action.

BRIEF DESCRIPTION OF THE DRAWINGS

Like reference symbols are employed in the drawings and in the description of the preferred embodiments to represent the same or very similar item or items.

DESCRIPTION OF THE PREFERRED EMBODIMENTS

Figure 1:
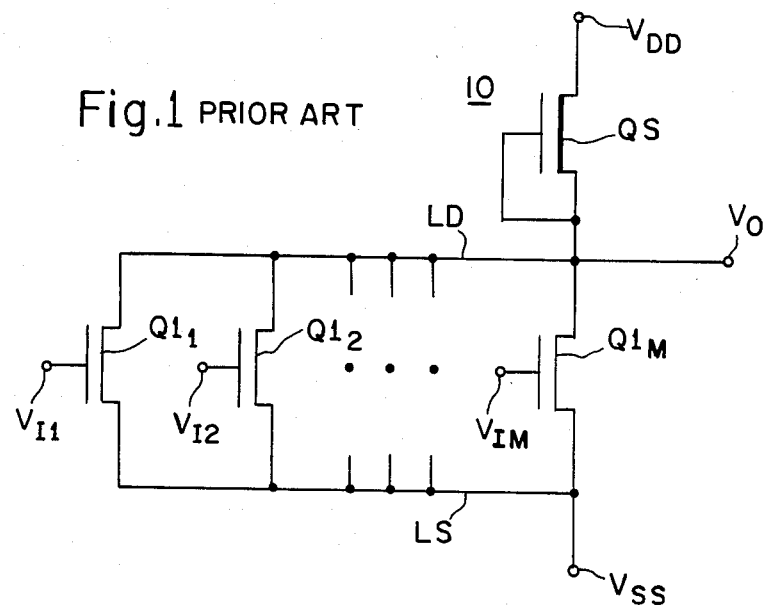
FIG. 1 is a circuit diagram of a prior art NOR gate.
Figure 2:
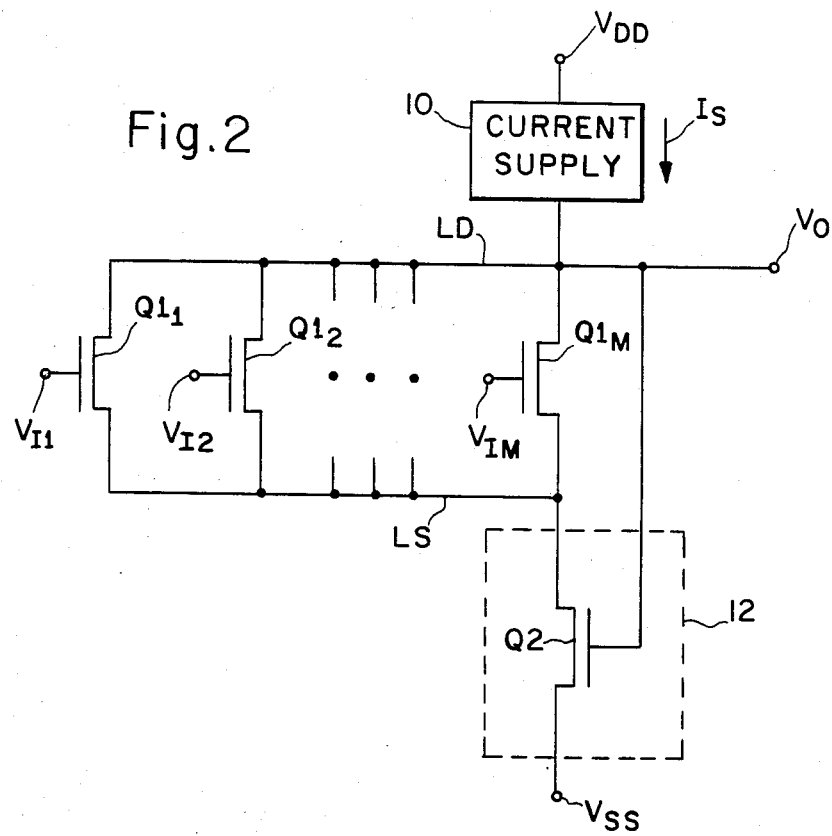
FIG. 2 is a circuit diagram of an embodiment of a NOR gate in accordance with the invention.

FIG. 2 illustrates a NOR gate having a logical low output clamp embodying the techniques of the invention. As in FIG. 1, this gate contains identical enhancement-mode N-channel insulated-gate FET's $Q1_1$–$Q1_M$ connected between conductors LS and LD for generating output $V_O$ as the logical NOR of inputs $V_{I1}$–$V_{IM}$ supplied to the gate electrodes. Current supply 10 is connected between conductor LD and the $V_{DD}$ terminal in FIG. 2 to act as a load for FET's $Q1_1$–$Q1_M$. Current supply 10 could, for example, be a depletion-mode resistively-connected N-channel FET as in FIG. 1.

Conductor LS is coupled to the $V_{SS}$ terminal in FIG. 2 through a clamp 12 consisting of an N-channel enhancement-mode insulated-gate FET Q2 whose gate electrode connects to conductor LD to receive output $V_O$. The source and drain of FET Q2 are respectively connected to the $V_{SS}$ terminal and conductor LS. When one or more of FET's $Q1_1$–$Q1_M$ are conductive, clamp 12/FET Q2 clamps output voltage $V_O$ at a low logical value $V_{OL}$ that is largely the same irrespective of how many of FET's $Q1_1$–$Q1_M$ are conductive. $V_{OL}$ lies between $V_{SS}$ and $V_{DD}$ considerably closer to $V_{SS}$. If $V_{DD}$ is about 5 volts greater than $V_{SS}$, $V_{OL}$ is typically about 1 volt above $V_{SS}$.

The NOR gate operates in basically the same way as that of FIG. 1 except that the logical "0" value of voltage $V_O$ is clamped at $V_{OL}$ rather than being variable. In looking at how the clamping action occurs, assume (for convenience) that $V_{SS}$ is ground reference. Output $V_O$ then equals the Q2 gate-to-source voltage $V_{GS2}$.

When voltage $V_O$ is at logical "0", current supply 10 provides a substantially constant current $I_S$ that flows through FET Q2 which is turned on. Each FET $Q1_1$,... or $Q1_M$ must itself be able to accommodate current $I_S$ when output $V_O$ is low since only one of FET's $Q1_1$–$Q1_M$ may be turned on.

Consider the case in which, for example, only FET $Q1_1$ is turned on. All of current $I_S$ flows through FET $Q1_1$. FET's Q2 and $Q1_1$ (as well as FET's $Q1_2$-$Q1_M$) are fabricated in such a manner that the Q2 threshold voltage $V_{TH2}$ exceeds the $Q1_1$ drain-to-source voltage $V_{DS11}$ when FET $Q1_1$ is conductive but FET's $Q1_2$-$Q1_M$ are non-conductive.

In FIG. 2, voltage $V_{GS2}$ equals voltage $V_{DS11}$ plus the Q2 drain-to-source voltage $V_{DS2}$. It follows that:

$$V_{GS2} - V_{DS2} < V_{TH2} \quad (1)$$

Under this condition, FET Q2 is in saturation. To a good approximation, voltage $V_{GS2}$ is given from the relationship:

$$V_{GS2} = V_{TH2} + (I_S/K)^{\frac{1}{2}} \quad (2)$$

K is a constant dependent on the charge carrier mobility, the gate-dielectric capacitance, and the FET width-to-length ratio. Since output $V_O$ equals voltage $V_{GS2}$, $V_O$ is dependent only on $V_{TH2}$, $I_S$, and K and is therefore largely independent of $V_{DS11}$.

Next, consider the case in which two or more of FET's $Q1_1$-$Q1_M$ are turned on. Let FET $Q1_1$ be one of the conducting FET's. Current $I_S$ flows through the conductive FET's, each carrying an approximately equal portion. Because the current through FET $Q1_1$ is less than in the previous case, voltage $V_{DS11}$ is also less. As a result, $V_{TH2}$ again exceeds $V_{DS11}$. Eq. (1) is satisfied so that FET Q2 is again in saturation. Eq. (2) is similarly satisfied since current $I_S$ still flows through FET Q2. Accordingly, output $V_O$ is substantially independent of parameters relating to the conductive conditions of FET's $Q1_1$-$Q1_M$. The result is that voltage $V_{OL}$ does not significantly depend on how many of FET's $Q1_1$-$Q1_M$ are turned on as long as at least one is conductive.

Clamp 12/FET Q2 provides negative feedback to stabilize voltage $V_{OL}$. If output $V_O$ rises slightly, FET Q2 starts to become more conductive and attempts to draw more current through those of FET's $Q1_1$-$Q1_M$ that are turned on. This acts to reduce their drain-to-source voltages so as to restore voltage $V_O$ to its previous value. The reverse occurs if output $V_O$ drops slightly.

Current $I_S$ is preferably supplied at a level that is largely independent of supply $V_{DD}$, temperature, and process conditions. Current supply 10 also compensates for changes in threshold $V_{TH2}$ resulting from process variations. Voltage $V_{OL}$ is then very stable over temperature, process variations, and supply $V_{DD}$.

If FET's $Q1_1$-$Q1_M$ are all off, output $V_O$ is high. FET Q2 does not conduct any significant current even though $V_{GS2}$ exceeds $V_{TH2}$. Current supply 10 preferably includes a mechanism for clamping voltage $V_O$ at a high level $V_{OH}$ lying between $V_{OL}$ and $V_{DD}$ but closer to $V_{OL}$. The difference between voltages $V_{OH}$ and $V_{OL}$ is typically about 1 volt. This makes the switching speed very high.

Figure 3:
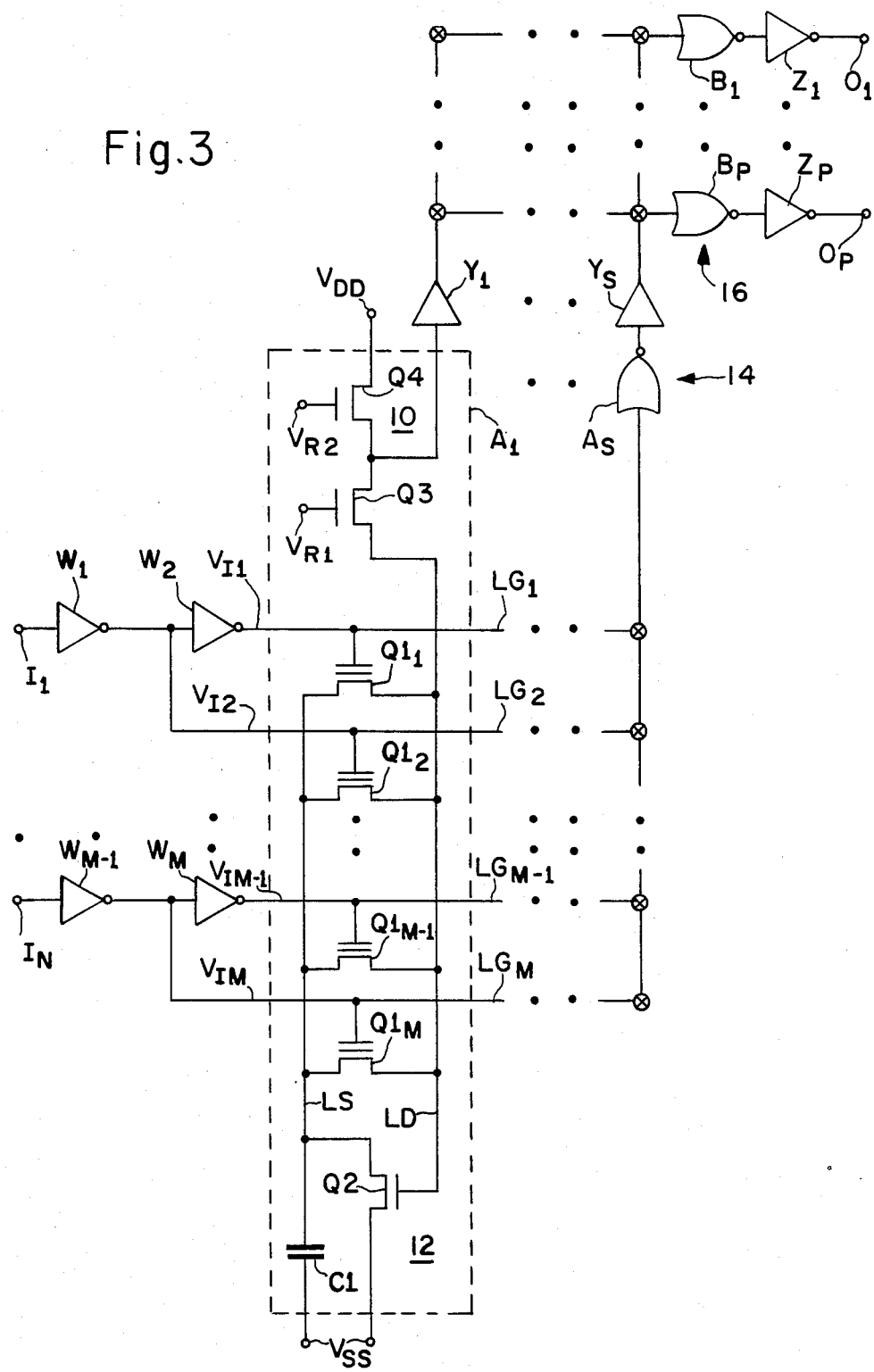
FIG. 3 is a circuit diagram of an embodiment of a two-level programmable logic device utilizing NOR gates in accordance with the invention.

FIG. 3 shows a two-level programmable logic device that utilizes the present clamping techniques in operating on N input signals $I_1$-$I_N$ to generate P output signals $O_1$-$O_P$. Inputs $I_1$-$I_N$ are provided to respective odd-numbered inverters $W_1$-$W_{M-1}$ (where M=2N) to produce even-numbered voltages $V_{I2}$-$V_{IM}$. These signals are respectively supplied to even-numbered inverters $W_2$-$W_M$ to produce odd-numbered voltages $V_{I1}$-$V_{IM-1}$. Conductors $LG_1$-$LG_M$ then transmit voltages $V_{I1}$-$V_{IM}$ to a programmable NOR array 14 consisting of S identical programmable NOR gates $A_1$-$A_S$. By virtue of DeMorgan's theorem, the combination of NOR array 14 with inverters $W_1$-$W_M$ functions as a programmable AND array.

High-impedance non-inverting buffers $Y_1$-$Y_S$ amplify the "ANDed" output signals from gates $A_1$-$A_S$. The amplified signals are provided to a programmable NOR array 16 consisting of P identical programmable NOR gates $B_1$-$B_P$. High-impedance inverting buffers $Z_1$-$Z_P$ invert the outputs from gates $B_1$-$B_P$ to generate signals $O_1$-$O_P$. The combination of NOR array 16 with inverters $Z_1$-$Z_P$ functions as a programmable OR array.

Gates $A_1$-$A_M$ and $B_1$-$B_M$ are all configured in substantially the same way. FIG. 3 illustrates details for typical gate $A_1$ which contains FET's $Q1_1$-$Q1_M$ and $Q2$ configured and operational as described above for FIG. 2 except that each of FET's $Q1_1$-$Q1_M$ is a floating-gate memory FET having a programmably controllable threshold voltage. In the unprogrammed state, the threshold voltage for each of FET's $Q1_1$-$Q1_M$ is low. During programming, the threshold voltages of certain of FET's $Q1_1$-$Q1_M$ are raised to a high level, typically greater than the power supply voltage. These FET's cannot be turned on during normal operation of the device and are therefore effectively absent from gate $A_1$.

Current supply 10 consists of enhancement-mode N-channel insulated-gate FET's Q3 and Q4 connected in series between conductor LD and the $V_{DD}$ terminal. Voltage $V_O$ is supplied to the source of FET Q3 whose drain provides the $A_1$ output signal. Reference voltages $V_{R1}$ and $V_{R2}$ are respectively supplied to the Q3 and Q4 gate electrodes. $V_{R1}$ and $V_{R2}$ are of such values that FET Q3 turns off when $V_O$ reaches about 0.4 volt above $V_{OL}$ (after FET's $Q1_1$-$Q1_M$ all go off). This clamps the logical high level of output $V_O$. The capacitance on conductor LD is also decoupled from that on the $A_1$ output conductor so as to increase the switching speed of the $A_1$ output signal.

Gate $A_1$ also has a capacitor C1 connected between conductor LS and the $V_{SS}$ supply. Capacitor C1 serves to increase switching speed but largely does not affect the operation of FET Q2.

In a preferred embodiment, $V_{SS}$ and $V_{DD}$ are 0 and 4.5-5.5 volts, respectively. The unprogrammed threshold voltage for each of memory FET's $Q1_1$-$Q1_M$ is about 1.5 volts. The programmed threshold voltage for the memory FET's is greater than 6 volts. Capacitor C1 is 1 picofarad.

Methods for manufacturing various elements of the present invention are well known in the semiconductor art. These elements are preferably fabricated in monolithic integrated circuit form according to conventional insulated-gate semiconductor techniques.

While the invention has been described with reference to particular embodiments, this description is solely for the purpose of illustration and is not to be construed as limiting the scope of the invention claimed below. For example, semiconductor elements of opposite polarity to those described above may be employed to accomplish the same results. Junction FET's could generally be used. Thus, various modifications, changes, and applications may be made by those skilled in the art without departing from the true scope and spirit of the invention as defined by the appended claims.

We claim:

1. A gate having: a plurality of like-polarity enhancement-mode first field-effect transistors (FET's), each of which has a gate electrode for receiving a corresponding input voltage, a source, and a drain; a conductor coupled to the drains for providing an output voltage; a current source coupled between the conductor and a terminal for a first supply voltage; and means coupling the sources to a terminal for a second supply voltage; characterized in that the coupling means includes a clamp that, when at least one of the first FET's is turned on, clamps the output voltage at a value that is largely the same regardless of the number of first FET's turned on.

2. A gate as in claim 1 characterized in that the clamped value of the output voltage lies between the supply voltages substantially closer to the second supply voltage.

3. A gate as in claim 2 characterized in that the clamp responds to an increase in the output voltage by causing current flowing between the sources and drains to increase so as to decrease the output voltage, and vice versa.

4. A gate as in claim 2 characterized in that the clamp comprises a like-polarity enhancement-mode second FET having a gate electrode coupled to the conductor, a source coupled to the terminal for the second supply voltage, and a drain coupled to the sources of the first FET's.

5. A gate as in claim 4 characterized in that the second FET is in saturation when at least one of the first FET's is turned on.

6. A gate as in claim 5 characterized in that each FET is an insulated-gate FET.

7. A gate as in claim 6 characterized in that each first FET has a programmably controllable threshold voltage.

8. A gate as in claim 7 characterized in that each first FET is a floating-gate FET.

9. A gate as in claim 5 characterized in that the current supply includes means that, when the first FET's are all turned off, clamps the output voltage at a value between the first-mentioned clamped value and the first supply voltage but closer to the first-mentioned clamped value.

10. A gate having: a plurality of like-polarity enhancement-mode first field-effect transistors (FET's), each of which has a gate electrode for receiving a corresponding input voltage, a source, and a drain; a conductor coupled to the drains for providing an output voltage; a current supply coupled between the conductor and a terminal for a first supply voltage; and means coupling the sources to a terminal for a second supply voltage; characterized in that the coupling means comprises a like-polarity enhancement-mode second FET having a gate electrode coupled to the conductor, a source coupled to the terminal for the second supply voltage, and a drain coupled to the sources of the first FET's.

11. A gate as in claim 10 characterized in that, when at least one of the first FET's is turned on, the second FET goes into saturation so as to force the output voltage to approach a value that is largely the same regardless of the number of first FET's turned on.

12. A gate as in claim 11 characterized in that the foregoing value of the output voltage lies between the supply voltages substantially closer to the second supply voltage.

13. A programmable array comprising:
  a group of substantially identical gates, each comprising:
    a plurality of like-polarity insulated-gate enhancement-mode field-effect transistors (FET's) of which each has a gate electrode for receiving a corresponding input voltage, a source, and a drain, each first FET having a programmable controllable threshold voltage;
    a conductor coupled to the drains for providing an output voltage;
    a current source coupled between the conductor and a terminal for a first supply voltage; and
    a like-polarity insulated-gate enhancement-mode second FET having a gate electrode coupled to the conductor, a source coupled to a terminal for a second supply voltage, and a drain coupled to the sources of the first FET's, the second FET acting as a clamp that, when at least one of the first FET's is turned on, clamps the output voltage at a value that is largely the same regardless of the number of first FET's turned in, the second FET being in saturation when at least one of the first FET's is turned on, the clamped value of the output voltage lying between the supply voltages substantially closer to the second supply voltage; and
  a like plurality of further conductors corresponding on a one-to-one basis to the first FET's of each gate, each further conductor coupled to the gate electrodes of all the corresponding first FET's.

14. An array as in claim 13 including input means for providing each consecutive pair of further conductors with voltages of opposite polarity.

* * * * *